(12) United States Patent
Sadhu et al.

(10) Patent No.: US 11,152,913 B2
(45) Date of Patent: Oct. 19, 2021

(54) BULK ACOUSTIC WAVE (BAW) RESONATOR

(71) Applicant: Qorvo US, Inc., Greensboro, NC (US)

(72) Inventors: Jyothi Swaroop Sadhu, Apopka, FL (US); Gernot Fattinger, Sorrento, FL (US); Robert Aigner, Ocoee, FL (US); Michael Schaefer, Mount Dora, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/290,175

(22) Filed: Mar. 1, 2019

(65) Prior Publication Data

US 2019/0305752 A1 Oct. 3, 2019

Related U.S. Application Data

(60) Provisional application No. 62/649,343, filed on Mar. 28, 2018.

(51) Int. Cl.
| | | |
|---|---|---|
| *H03H 9/17* | (2006.01) | |
| *H03H 9/02* | (2006.01) | |
| *H03H 9/54* | (2006.01) | |

(52) U.S. Cl.
CPC .......... *H03H 9/17* (2013.01); *H03H 9/02015* (2013.01)

(58) Field of Classification Search
CPC ...... H03H 9/17; H03H 9/178; H03H 9/02015; H03H 9/02031; H03H 9/54; H01L 41/18
USPC .................................. 333/187, 189; 310/357
See application file for complete search history.

(56) References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,442,434 A | 4/1984 | Baekgaard |
| 4,577,168 A | 3/1986 | Hartmann |
| 5,291,159 A | 3/1994 | Vale |
| 6,067,391 A | 5/2000 | Land |
| 6,670,866 B2 | 12/2003 | Ella et al. |
| 6,714,099 B2 | 3/2004 | Hikita et al. |
| 6,720,844 B1 | 4/2004 | Lakin |
| 6,927,649 B2 | 8/2005 | Metzger et al. |

(Continued)

FOREIGN PATENT DOCUMENTS

JP 2012257050 A 12/2012

OTHER PUBLICATIONS

Jose Capilla et al., High-Acoustic-Impedance Tantalum Oxide Layers for Insulating Acoustic Reflectors, Mar. 2012, IEEE vol. 59, No. 3, 7 pages. (Year: 2012).*

(Continued)

*Primary Examiner* — Dean O Takaoka
(74) *Attorney, Agent, or Firm* — Withrow & Terranova, PLLC

(57) ABSTRACT

An acoustic resonator includes a first piezoelectric layer, a second piezoelectric layer, a coupler layer, a first electrode, and a second electrode. The first piezoelectric layer has a first polarity. The second piezoelectric layer has a second polarity opposite the first polarity. The coupler layer is between the first piezoelectric layer and the second piezoelectric layer. The first electrode is on the first piezoelectric layer opposite the coupler layer. The second electrode is on the second piezoelectric layer opposite the coupler layer.

20 Claims, 9 Drawing Sheets

(56) References Cited

U.S. PATENT DOCUMENTS

| | | | |
|---|---|---|---|
| 6,927,651 B2 * | 8/2005 | Larson, III | H03H 3/04 |
| | | | 310/366 |
| 6,975,183 B2 * | 12/2005 | Aigner | H03H 9/0095 |
| | | | 29/25.35 |
| 7,057,478 B2 | 6/2006 | Korden et al. | |
| 7,173,504 B2 | 2/2007 | Larson, III et al. | |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,367,095 B2 | 5/2008 | Larson, III et al. | |
| 7,391,285 B2 | 6/2008 | Larson, III et al. | |
| 7,436,269 B2 | 10/2008 | Wang et al. | |
| 7,515,018 B2 | 4/2009 | Handtmann et al. | |
| 7,804,374 B1 | 9/2010 | Brown et al. | |
| 7,825,749 B2 | 11/2010 | Thalhammer et al. | |
| 7,855,618 B2 | 12/2010 | Frank et al. | |
| 7,889,024 B2 * | 2/2011 | Bradley | H03H 9/583 |
| | | | 310/357 |
| 7,898,493 B1 | 3/2011 | Rojas et al. | |
| 7,956,705 B2 | 6/2011 | Meister et al. | |
| 7,973,620 B2 | 7/2011 | Shirakawa et al. | |
| 8,248,185 B2 | 8/2012 | Choy et al. | |
| 8,508,315 B2 | 8/2013 | Jamneala et al. | |
| 8,575,820 B2 * | 11/2013 | Shirakawa | H03H 3/02 |
| | | | 310/320 |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2 | 11/2015 | Miyake | |
| 9,243,316 B2 * | 1/2016 | Larson, III | C23C 14/022 |
| 9,484,883 B2 | 11/2016 | Nishizawa et al. | |
| 9,698,756 B2 | 7/2017 | Khlat et al. | |
| 9,837,984 B2 | 12/2017 | Khlat et al. | |
| 9,847,769 B2 | 12/2017 | Khlat et al. | |
| 9,887,686 B2 | 2/2018 | Kuwahara | |
| 9,929,716 B2 | 3/2018 | Lee et al. | |
| 10,009,001 B2 | 6/2018 | Jiang et al. | |
| 10,141,644 B2 | 11/2018 | Khlat et al. | |
| 2002/0109564 A1 | 8/2002 | Tsai et al. | |
| 2004/0100342 A1 | 5/2004 | Nishihara et al. | |
| 2005/0057117 A1 | 3/2005 | Nakatsuka et al. | |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2008/0007369 A1 | 1/2008 | Barber et al. | |
| 2008/0169884 A1 | 7/2008 | Matsumoto et al. | |
| 2008/0297278 A1 | 12/2008 | Handtmann et al. | |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0115334 A1 | 5/2011 | Konishi et al. | |
| 2011/0121689 A1 * | 5/2011 | Grannen | C30B 23/02 |
| | | | 310/357 |
| 2011/0204995 A1 | 8/2011 | Jamneala et al. | |
| 2011/0210787 A1 | 9/2011 | Lee et al. | |
| 2012/0007696 A1 | 1/2012 | Pang et al. | |
| 2012/0187799 A1 | 7/2012 | Nakahashi | |
| 2012/0313725 A1 | 12/2012 | Ueda et al. | |
| 2013/0033150 A1 | 2/2013 | Bardong et al. | |
| 2013/0113576 A1 | 5/2013 | Inoue et al. | |
| 2013/0193808 A1 * | 8/2013 | Feng | H03H 9/173 |
| | | | 310/360 |
| 2014/0132117 A1 * | 5/2014 | Larson, III | C23C 14/025 |
| | | | 310/357 |
| 2014/0145557 A1 | 5/2014 | Tanaka | |
| 2014/0167565 A1 | 6/2014 | Iwamoto | |
| 2015/0222246 A1 | 8/2015 | Nosaka | |
| 2015/0280100 A1 * | 10/2015 | Burak | H01L 41/0477 |
| | | | 310/321 |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 | 9/2016 | Xu et al. | |
| 2016/0308576 A1 | 10/2016 | Khlat et al. | |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 | 5/2017 | Schmidhammer | |
| 2017/0201233 A1 | 7/2017 | Khlat | |
| 2017/0301992 A1 | 10/2017 | Khlat et al. | |
| 2017/0324159 A1 | 11/2017 | Khlat | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0076794 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0219530 A1 | 8/2018 | Khlat et al. | |
| 2018/0241418 A1 | 8/2018 | Takamine et al. | |
| 2018/0358947 A1 | 12/2018 | Mateu et al. | |
| 2019/0140618 A1 | 5/2019 | Takamine | |
| 2019/0181835 A1 | 6/2019 | Timme et al. | |
| 2019/0199320 A1 | 6/2019 | Morita et al. | |
| 2019/0207583 A1 | 7/2019 | Miura et al. | |
| 2019/0222197 A1 | 7/2019 | Khlat et al. | |
| 2019/0288664 A1 | 9/2019 | Saji | |

OTHER PUBLICATIONS

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

Ex Parte Quayle Action for U.S. Appl. No. 15/347,452, mailed Jun. 15, 2017, 7 pages.

Final Office Action for U.S. Appl. No. 15/275,957, dated Jan. 2, 2018, 7 pages.

Author Unknown, "SAW Filters—SAW Resonators: Surface Acoustic Wave SAW Components," Product Specification, 2010, Token Electronics Industry Co., Ltd., 37 pages.

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

Kwa, Tom, "Wafer-Level Packaged Accelerometer With Solderable SMT Terminals," IEEE Sensors, Oct. 22-25, 2006, Daegu, South Korea, IEEE, pp. 1361-1364.

Lakin, K. M., "Coupled Resonator Filters," 2002 IEEE Ultrasonics Symposium, Oct. 8-11, 2002, Munich, Germany, 8 pages.

López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.

Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.

Schneider, Robert, "High-Q AIN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.

(56) References Cited

OTHER PUBLICATIONS

Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Non-Final Office Action for U.S. Appl. No. 15/883,933, dated Oct. 25, 2019, 19 pages.
Final Office Action for U.S. Appl. No. 15/697,658, dated Oct. 22, 2019, 9 pages.
Fattinger, Gernot et al., ""Single-to-balanced Filters for Mobile Phones using Coupled Resonator BAW Technology,"" 2004 IEEE International Ultrasonics, Ferroelectrics, and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/003,417, dated Apr. 3, 2020, 9 pages.
Final Office Action for U.S. Appl. No. 15/883,933, dated Oct. 23, 2020, 15 pages.
Notice of Allowance and Examiner-Initiated Interview Summary for U.S. Appl. No. 16/003,417, dated Aug. 5, 2020, 9 pages.
Non-Final Office Action for U.S. Appl. No. 16/358,823, dated Apr. 5, 2021, 12 pages.
Non-Final Office Action for U.S. Appl. No. 15/883,933, dated Mar. 29, 2021, 11 pages.
Non-Final Office Action for U.S. Appl. No. 16/740,667, dated Mar. 4, 2021, 10 pages.
Non-Final Office Action for U.S. Appl. No. 16/776,738, dated Mar. 4, 2021, 7 pages.
Non-Final Office Action for U.S. Appl. No. 16/806,166, dated Mar. 18, 2021, 6 pages.
Non-Final Office Action for U.S. Appl. No. 16/283,044, dated Nov. 12, 2020, 9 pages.
Notice of Allowance for U.S. Appl. No. 15/697,658, dated Nov. 17, 2020, 7 pages.
Advisory Action for U.S. Appl. No. 15/883,933, dated Dec. 31, 2020, 3 pages.
Notice of Allowance for U.S. Appl. No. 16/740,667, dated Jun. 11, 2021, 7 pages.
Notice of Allowance for U.S. Appl. No. 16/776,738, dated Jun. 11, 2021, 7 pages.
Notice of Allowance for U.S. Appl. No. 16/806,166, dated Jun. 18, 2021, 7 pages.

\* cited by examiner

BULK ACOUSTIC WAVE (BAW) RESONATOR

RELATED APPLICATIONS

This application claims the benefit of provisional patent application Ser. No. 62/649,343, filed Mar. 28, 2018, the disclosure of which is hereby incorporated herein by reference in its entirety.

FIELD OF THE DISCLOSURE

The present disclosure relates to bulk acoustic wave (BAW) resonators capable of operating in higher order modes with enhanced piezoelectric coupling.

BACKGROUND

FIG. 1 shows a fundamental mode bulk acoustic wave (BAW) resonator 10. The fundamental mode BAW resonator 10 includes a piezoelectric layer 12 between a first electrode 14 and a second electrode 16. Thicknesses of the piezoelectric layer 12, the first electrode 14, and the second electrode 16 are shown in terms of a distance from a center of a thickness of the fundamental mode BAW resonator 10, where d is the thickness of one half of the piezoelectric layer 12 and t is the thickness of both the first electrode 14 and the second electrode 16.

FIG. 2 illustrates a stress profile (solid line 18) and displacement profile (dashed line 20) of the fundamental mode BAW resonator 10. As illustrated, the fundamental mode BAW resonator 10 operates in a fundamental mode in which a stress profile corresponding with half of a wavelength of a sinusoid is fit within a thickness of the piezoelectric layer 12. The effective electromechanical coupling ($k_{eff}^2$) of the fundamental mode BAW resonator 10 depends on an integral of the stress profile over a thickness of the piezoelectric layer 12. Generally, a higher electromechanical coupling coefficient is desirable. While not shown, those skilled in the art will appreciate that the stress profile may become steeper at the interface between the piezoelectric layer 12, the first electrode 14, and the second electrode 16.

The possibility of exciting higher order modes in BAW resonators promises filters capable of operating at higher frequencies than if conventional, fundamental mode BAW resonators were used while maintaining reasonable quality factor, size, and electrode thickness. In higher order modes, stress profiles corresponding with integer multiples of the frequency of the fundamental mode are excited in the piezoelectric layer. For example, in a second order mode, also referred to herein as a second overmode, an entire wavelength of a sinusoid (twice the frequency of the fundamental mode) is fit within a thickness of the piezoelectric layer.

While BAW resonators capable of operating in higher modes promise improved performance at high frequencies, attempts to create such devices have provided very poor electromechanical coupling compared to fundamental mode devices such as the fundamental mode BAW resonator 10 discussed above. Accordingly, there is a need for BAW resonators capable of operating in higher order modes such as a second order mode with improved electromechanical coupling.

SUMMARY

In one embodiment, an acoustic resonator includes a first piezoelectric layer, a second piezoelectric layer, a coupler layer, a first electrode, and a second electrode. The first piezoelectric layer has a first polarity. The second piezoelectric layer has a second polarity opposite the first polarity. The coupler layer is between the first piezoelectric layer and the second piezoelectric layer. The first electrode is on the first piezoelectric layer opposite the coupler layer. The second electrode is on the second piezoelectric layer opposite the coupler layer. Providing the coupler layer between the first piezoelectric layer and the second piezoelectric layer increases an electromechanical coupling coefficient of the acoustic resonator, thereby improving the performance thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
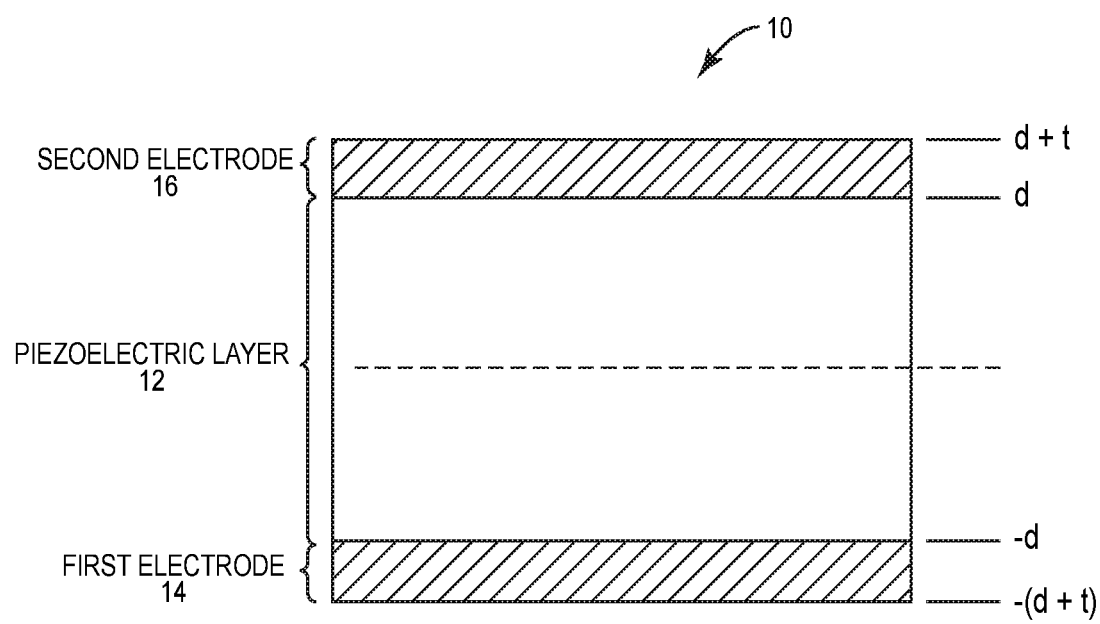
FIG. 1 illustrates a fundamental mode bulk acoustic wave (BAW) resonator.
Figure 2:
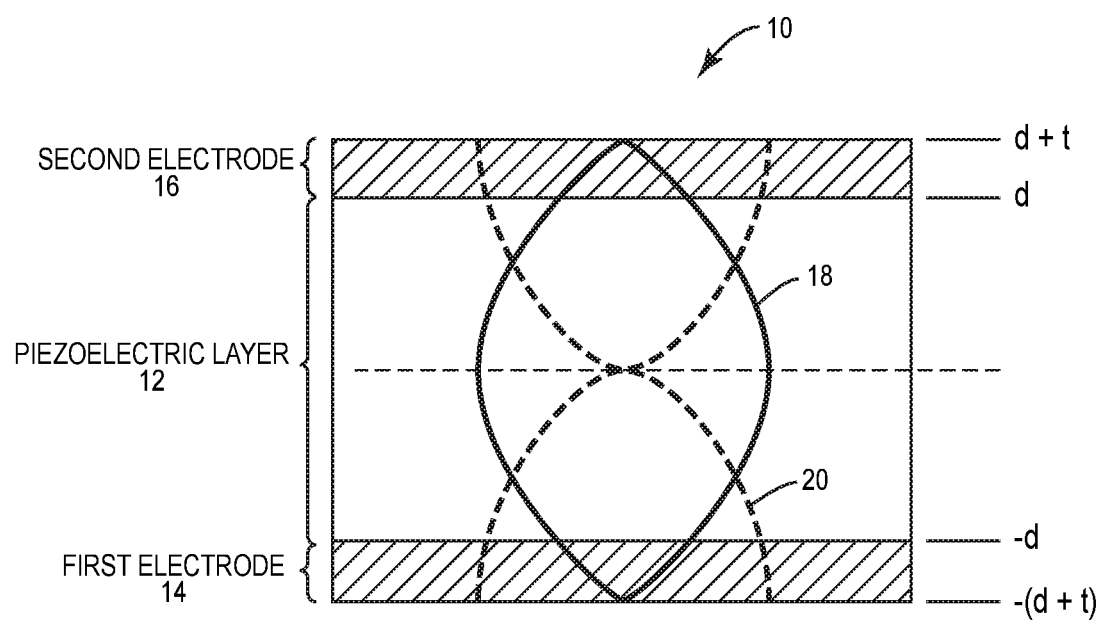
FIG. 2 illustrates a stress response and displacement profile of a fundamental mode BAW resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
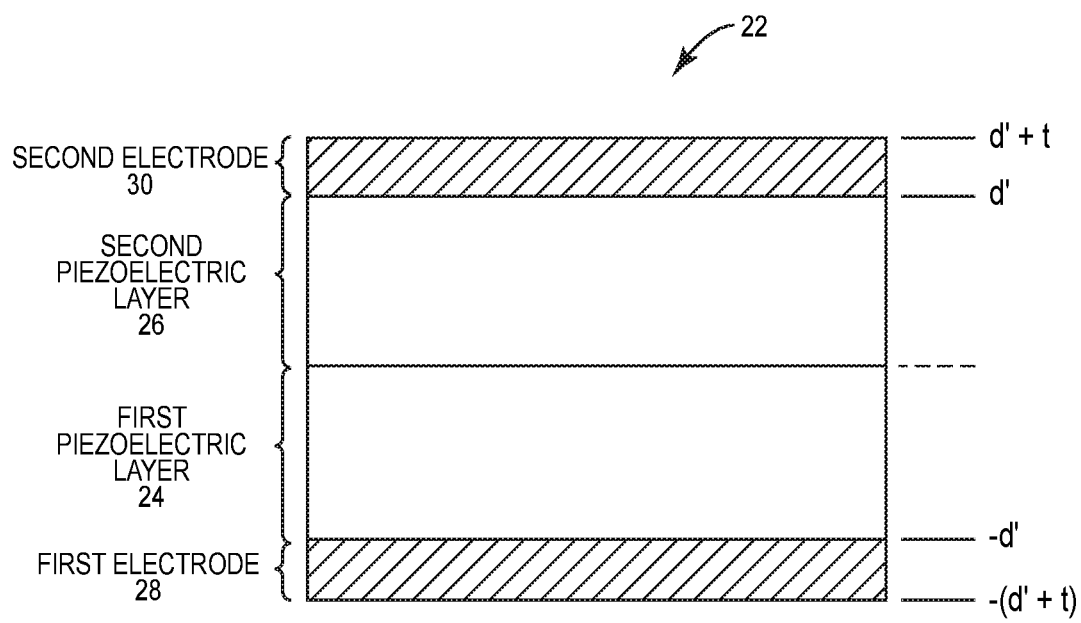
FIG. 3 illustrates a second overmode BAW resonator according to one embodiment of the present disclosure.

FIG. 3 shows a second overmode bulk acoustic wave (BAW) resonator 22 according to one embodiment of the present disclosure. The second overmode BAW resonator 22 includes a first piezoelectric layer 24, a second piezoelectric layer 26 on the first piezoelectric layer 24, a first electrode 28 on the first piezoelectric layer 24 opposite the second piezoelectric layer 26, and a second electrode 30 on the second piezoelectric layer 26 opposite the first piezoelectric layer 24. Thicknesses of the first piezoelectric layer 24, the second piezoelectric layer 26, the first electrode 28, and the second electrode 30 are shown in terms of a distance from a center of a thickness of the BAW resonator 10, where d' is the thickness of the first piezoelectric layer 24 and the second piezoelectric layer 26 and t is the thickness of both the first electrode 28 and the second electrode 30.

Notably, the first piezoelectric layer 24 has a first polarity, while the second piezoelectric layer 26 has a second polarity that is opposite the first polarity. These polarities have opposing signs of the piezoelectric constant and therefore respond in opposite fashion to the electric field. This allows the second overmode BAW resonator 22 to excite a second order mode as discussed below. In one embodiment, the first piezoelectric layer 24 and the second piezoelectric layer 26 are aluminum nitride (AlN) layers having opposite polarities. For example, the first piezoelectric layer 24 may be a nitrogen polar layer of aluminum nitride (c-AlN), while the second piezoelectric layer 26 may be an aluminum polar layer of aluminum nitride (f-AlN). Said aluminum nitride may be undoped or doped with one or more of scandium (Sc), erbium (Er), magnesium (Mg), hafnium (Hf), or the like. The first electrode 28 and the second electrode 30 may be metal layers. For example, the first electrode 28 and the second electrode 30 may be aluminum (Al), molybdenum (Mo), tungsten (W), or the like. The thickness (d') of the first piezoelectric layer 24 and the second piezoelectric layer 26 and the thickness (t) of the first electrode 28 and the second electrode 30 may be chosen to provide specific electrical and/or acoustic characteristics in order to change one or more operating parameters of the second overmode BAW resonator 22.

Figure 4:
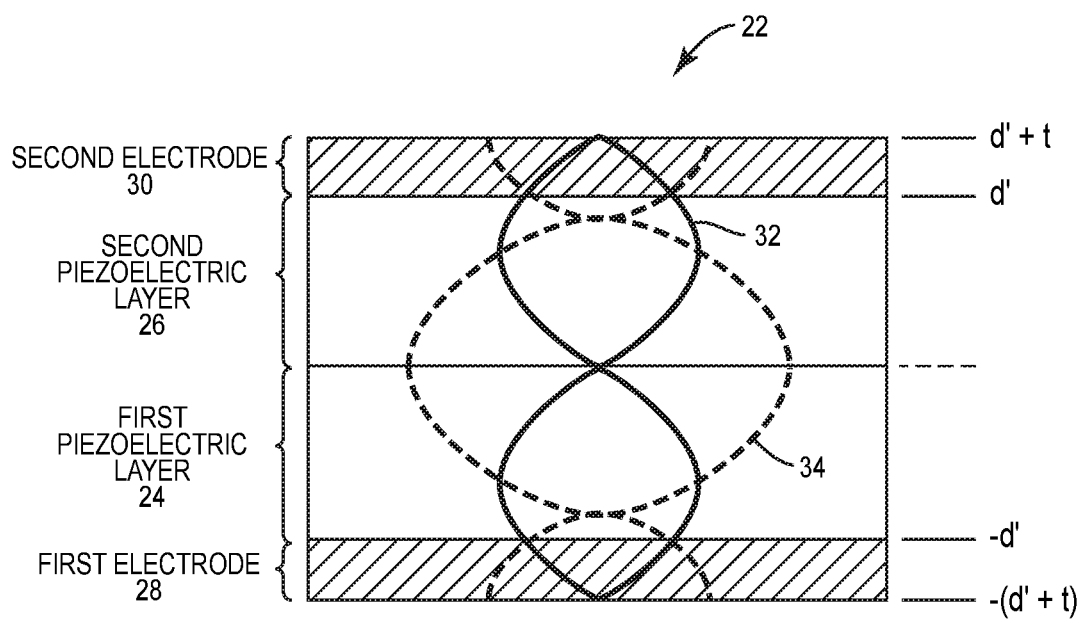
FIG. 4 illustrates a stress profile and displacement profile of a second overmode BAW resonator according to one embodiment of the present disclosure.

FIG. 4 illustrates a stress profile (solid line 32) and displacement profile (dashed line 34) of the second overmode BAW resonator 22. As illustrated, the BAW resonator operates in a second order mode, also referred to herein as a second overmode, in which a stress profile corresponding with a full wavelength of a sinusoid is fit within a thickness of the combination of the first piezoelectric layer 24 and the second piezoelectric layer 26. While not shown, those skilled in the art will appreciate that the stress profile may become steeper at the interface of the first piezoelectric layer 24 and the first electrode 28 and at the interface of the second piezoelectric layer 26 and the second electrode 30.

As discussed above, one problem facing BAW resonators attempting to excite higher order modes is that they generally have a lower electromechanical coupling coefficient ($k_{eff}^2$) than their fundamental mode counterparts. This is illustrated by a comparison of the fundamental mode BAW resonator 10 discussed above in the background with the second overmode BAW resonator 22. Assuming the electrodes in both the fundamental mode BAW resonator 10 and the second overmode BAW resonator 22 have the same material properties as the piezoelectric layer(s) therein, the displacement profile u(z) of the devices can be expressed according to Equation (1):

$$u(z) = \begin{cases} a\sin k_p z & \text{fundamental} \\ a\cos k_p z & 2^{nd} \text{ overmode} \end{cases} \quad (1)$$

where a is the mode amplitude and the wavevector $k_p$ is obtained by using stress free boundary conditions T(±d+t)=0 such that $k_p = \pi/2(d+t)$ for the fundamental mode BAW resonator 10 and $k_p = \pi/(d'+t)$ for the second overmode BAW resonator 22. A primitive method of calculating the effective electromechanical coupling of these structures comes from the Belincourt formula, which compares stored energy in electrical and mechanical domains. While more sophisticated methods are available for calculating $k_{eff}^2$, the treatment shown below provides an intuitive understanding of the principles discussed herein. Using the Belincourt relation, the electromechanical coupling coefficient $k_{eff}^2$ is expressed according to Equation (2):

$$k_{eff}^2 = \frac{U_m^2}{U_e U_d} \qquad (2)$$

where $U_m$ is energy stored in the piezoelectric layers by interchange between electrical and mechanical domains, and is expressed according to Equation (3):

$$U_m = \frac{1}{2}\int_{-d}^{d} e(z) E \frac{\partial u}{\partial z} dz \qquad (3)$$

$U_e$ is the mechanical energy stored with the piezoelectric layers, and is expressed according to Equation (4):

$$U_e = \frac{1}{2}\int_{-d-t}^{d+t} c^p \left(\frac{\partial u}{\partial x}\right)^2 dz \qquad (4)$$

and $U_d$ is the electrical energy stored within the dielectric, and is expressed according to Equation (5):

$$U_d = \in E^2 d \qquad (5)$$

where e(z) is the piezoelectric constant, E is the electric field, and $c^p$ and $\in$ are the electric constant and dielectric constant of the piezoelectric layer. For piezoelectric films like aluminum nitride, e(z) is the $e_{33}$, which is the piezoelectric constant along the c-axis. Substituting the equations for u(z) from Equation (1) into Equation (2), the electromechanical coupling coefficient of the fundamental mode BAW resonator 10 can be expressed according to Equation (6):

$$k_{eff,fm}^2 = \frac{e^2}{c^p \in} \frac{8}{\pi^2} \frac{\cos^2\left(\frac{\pi m}{2}\right)}{1-m} \qquad (6)$$

and the electromechanical coupling coefficient of the second overmode BAW resonator 10 can be expressed according to Equation (7):

$$k_{eff,so}^2 = \frac{e^2}{c^p \in} \frac{8}{\pi^2} \frac{\cos^4\left(\frac{\pi m}{2}\right)}{1-m} \qquad (7)$$

A relationship between the electromechanical coupling coefficient of the fundamental mode BAW resonator 10 and the second overmode BAW resonator 22 can be expressed according to Equation (8):

$$\frac{k_{eff,fm}^2}{k_{eff,so}^2} = \cos^2\left(\frac{\pi m}{2}\right) < 1 \qquad (8)$$

Equation (8) shows that the second overmode BAW resonator 22 always has a lower electromechanical coupling coefficient than the fundamental mode BAW resonator 10. For most applications, the typical value for m is between 0.2 and 0.3, in which case the electromechanical coupling coefficient of the second overmode BAW resonator is only 80-90% that of the fundamental mode BAW resonator 10.

Figure 5:
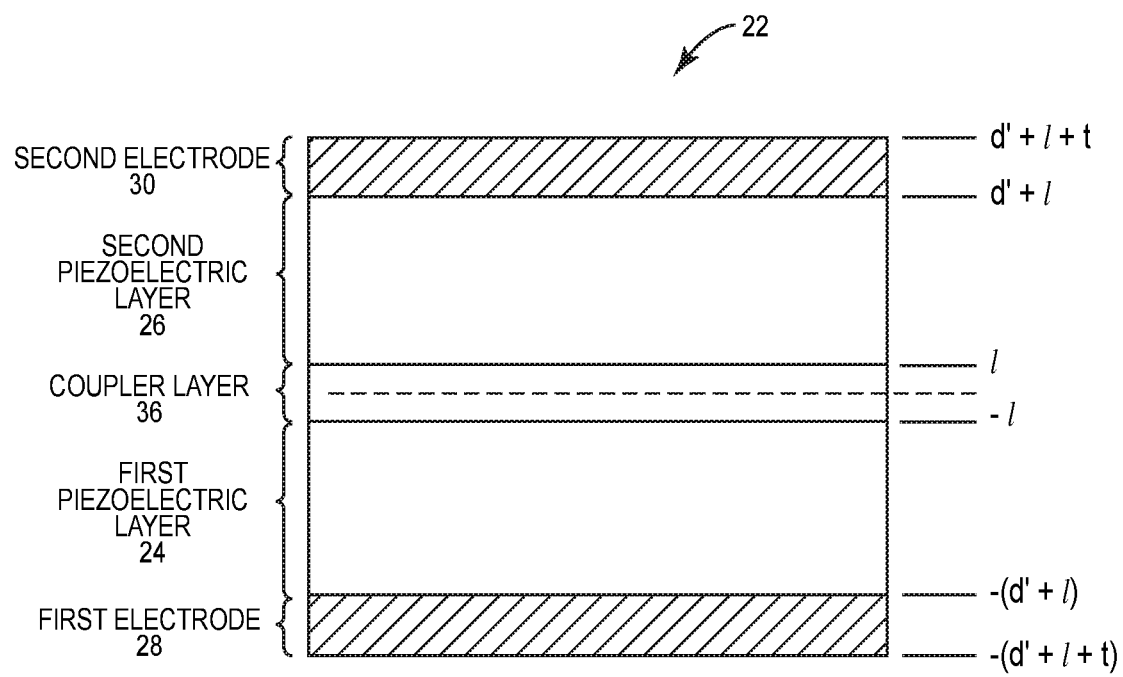
FIG. 5 illustrates a second overmode BAW resonator according to one embodiment of the present disclosure.

To improve the electromechanical coupling coefficient of the second overmode BAW resonator 22, a coupler layer 36 is added between the first piezoelectric layer 24 and the second piezoelectric layer 26 as shown in FIG. 5. The coupler layer has a thickness 2l. As discussed below, the coupler layer 36 provides a desired acoustic impedance between the first piezoelectric layer 24 and the second piezoelectric layer 26 in order to increase an integral of the stress profile of the second overmode BAW resonator 22 and thereby improve the electromechanical coupling coefficient thereof. In an alternative embodiment, the coupler layer can serve two purposes: (i) to enhance effective electromechanical coupling through its acoustic impedance and (ii) serve as the layer that causes inversion in polarity for the second piezoelectric layer deposited on top of it.

Equation (1) can be rewritten to express the displacement profile u(z) of the second overmode BAW resonator 22 including the coupler layer 36 as expressed in Equation (9):

$$u(z) = \begin{cases} b\cos k_c z & -\ell < z < \ell \\ a\cos k_p z & \text{elsewhere} \end{cases} \qquad (9)$$

where $k_p$ is the wavevector in the first piezoelectric layer 24 and the second piezoelectric layer 26 and $k_c$ is the wavevector in the coupler layer 36. Using displacement and stress continuity boundary conditions at z=±l, we obtain Equation (10):

$$Z_p \tan k_p l = Z_c \tan k_c l \qquad (10)$$

where $Z_p$ is the acoustic impedance of the first piezoelectric layer 24 and the second piezoelectric layer 26 and $Z_c$ is the acoustic impedance of the coupler layer 36. The electromechanical energy $U_m$ of the second overmode BAW resonator 22 without the coupler layer 36 is expressed according to Equation (11):

$$U_{m,nc} = 2aeE\sin^2\frac{k_p d'}{2} \qquad (11)$$

and the electromechanical energy $U_m$ of the second overmode BAW resonator 22 with the coupler layer 36 is expressed according to Equation (12):

$$U_{m,c} = 2aeE\sin k_p\left(\frac{d'+2l}{2}\right)\sin\frac{k_p d'}{2} \qquad (12)$$

while a closed form solution to the elastic energy $U_e$ is difficult because of the complex relationship between $k_c$ and $k_p$, numerical methods can be used to solve the system of Equation (9) through Equation (12) to obtain the mode shapes u(z) and stress profile σ(z). Using u(z), we can calculate the electromechanical coupling using Equation (2) through Equation (5) to show that the coupler layer 36 increases the electromechanical coupling coefficient of the second overmode BAW resonator 22.

Figure 6:
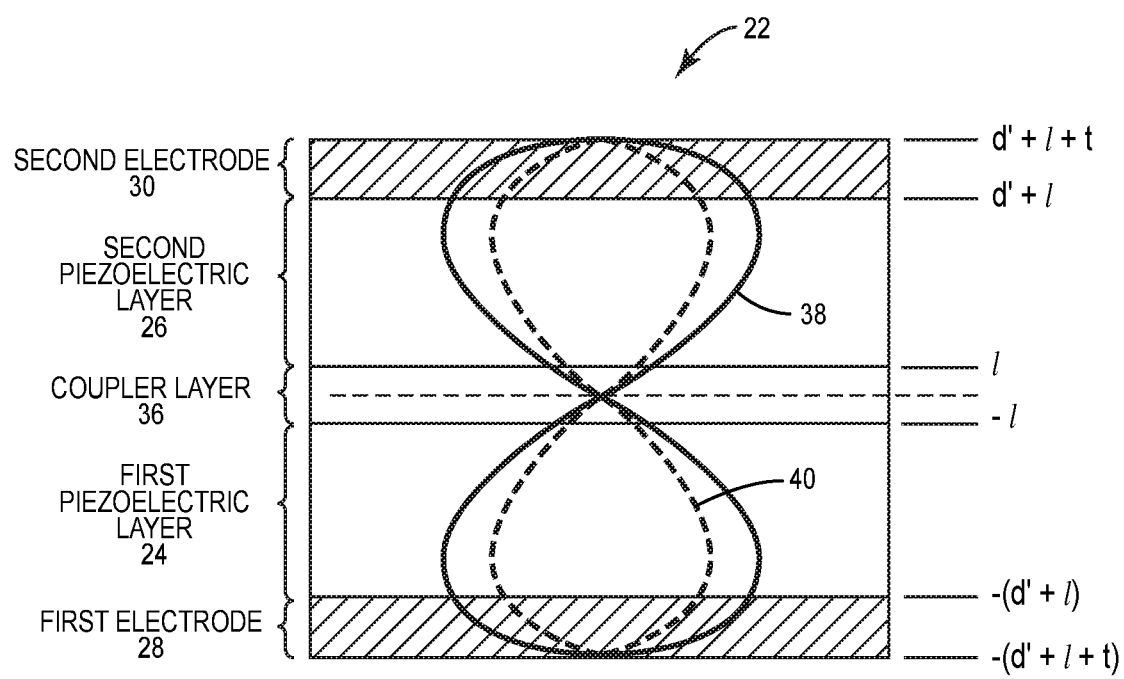
FIG. 6 illustrates a stress profile of two second overmode BAW resonators according to various embodiments of the present disclosure.

FIG. 6 illustrates a stress profile (solid line 38) of the second overmode BAW resonator 22 including the coupler layer 36 and a displacement profile (dashed line 40) of the second overmode BAW resonator 22 without the coupler layer 36. As shown, the coupler layer 36 forces further acoustic energy into the first piezoelectric layer 24 and the second piezoelectric layer 26, thus increasing the integral of the stress profile and thus the electromechanical coupling coefficient. While not shown, those skilled in the art will appreciate that the stress profile may become steeper at the interface of the first piezoelectric layer 24 and the first electrode 28 and at the interface of the second piezoelectric layer 26 and the second electrode 30.

Figure 7:
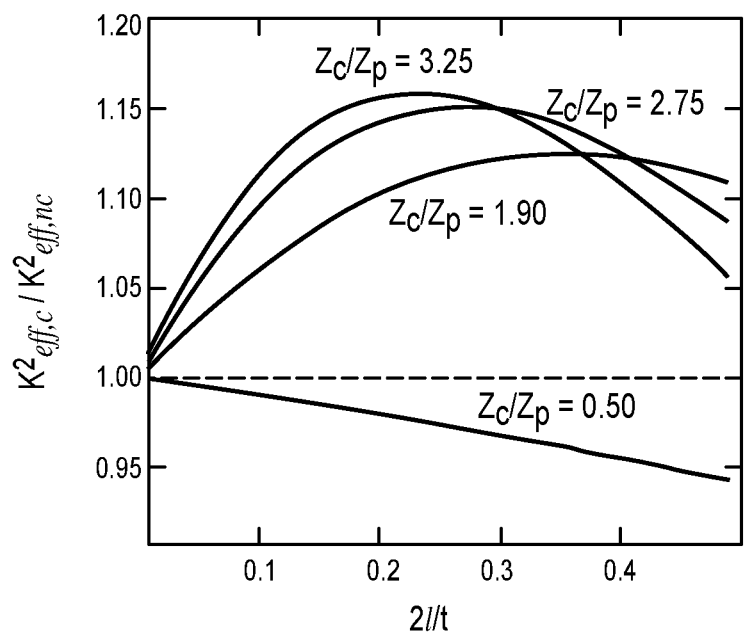
FIG. 7 is a graph illustrating the performance characteristics of several second overmode BAW resonators according to various embodiments of the present disclosure.

A relationship between the acoustic impedance ($Z_c$) of the coupler layer 36 and the acoustic impedance ($Z_p$) of the first piezoelectric layer 24 and the second piezoelectric layer 26 may change the electromechanical coupling coefficient of the second overmode BAW resonator 22. A desirable electromechanical coupling coefficient may be achieved when the acoustic impedance of the coupler layer 36 divided by the acoustic impedance of the first piezoelectric layer 24 and the second piezoelectric layer 26 ($Z_c/Z_p$) is greater than 1.0, greater than 1.5, greater than 2.0, and greater than 3.0 in various embodiments. Acoustic impedance of the coupler layer 36 divided by the acoustic impedance of the first piezoelectric layer 24 and the second piezoelectric layer 26 ($Z_c/Z_p$) may be constrained by the acoustic impedance available for the material of the coupler layer 36, and thus may be less than 10.0, less than 8.0, and less than 6.0 in various embodiments. Further, a relationship between the thickness (2l) of the coupling layer 36 and the thickness (t) of the first electrode 28 and the second electrode 30 may also change the electromechanical coupling coefficient. A desirable electromechanical coupling coefficient may be achieved when the thickness of the coupling layer 36 divided by the thickness of the first electrode 28 and the second electrode 30 (2l/t) is between 0.1 and 0.4, and more specifically between 0.1 and 0.2, between 0.1 and 0.3, between 0.2 and 0.3, between 0.2 and 0.4, and between 0.3 and 0.4. FIG. 7 is a graph illustrating these relationships. Specifically, FIG. 7 is a graph showing on the x-axis the thickness of the coupler layer 36 divided by the thickness of the first electrode 28 and the second electrode 30 (2l/t) and on the y-axis a ratio of improvement of the electromechanical coupling coefficient for the second overmode BAW resonator 22 with the coupler layer 36 vs. without the coupler layer 36 (i.e., the electromechanical coupling coefficient ($k_{eff,c}^2$) of the second overmode BAW resonator 22 with the coupler layer 36 divided by the electromechanical coupling coefficient ($k_{eff,nc}^2$) of the second overmode BAW resonator 22 without the coupler layer 36). Each line in the graph illustrates a particular relationship between the acoustic impedance of the coupler layer 36 and the acoustic impedance of the first piezoelectric layer 24 and the second piezoelectric layer 26 ($Z_c/Z_p$).

In one embodiment, the coupler layer 36 is a metal layer. The coupler layer 36 may be aluminum (Al), molybdenum (Mo), tungsten (W), or osmium (Os). Depending on the material chosen for the coupler layer 36, a thickness of the coupler layer 36 may be modified to provide a desired acoustic response in order to increase the electromechanical coupling coefficient of the second overmode BAW resonator 22. For a coupler layer 36 with a thickness of 60 nm and a first piezoelectric layer 24 and second piezoelectric layer 26 of aluminum nitride (AlN) with a thickness of 700 nm, the acoustic impedance of the coupler layer 36 divided by the acoustic impedance of the first piezoelectric layer 24 and the second piezoelectric layer 26 ($Z_c/Z_p$) for an aluminum (Al) coupler layer 36 is 0.50, for a molybdenum (Mo) coupler layer 36 is 1.90, for a tungsten (W) coupler layer 36 is 2.75, and for an osmium (Os) coupler layer 36 is 3.25. In various embodiments, a thickness of the first piezoelectric layer 24 and the second piezoelectric layer 26 may be 350 nm to 1050 nm, a thickness of the first electrode 28 and the second electrode 30 may be between 100 nm and 300 nm, and a thickness of the coupler layer 36 may be between 30 nm and 90 nm. A thickness of the coupler layer 36 may comprise any sub-range within this range, such that a thickness of the coupler layer 36 may be between 30 nm and 40 nm, between 30 nm and 50 nm, between 30 nm and 60 nm, between 30 nm and 70 nm, between 30 nm and 80 nm, between 40 nm and 50 nm, between 40 nm and 60 nm, between 40 nm and 70 nm, between 40 nm and 80 nm, between 40 nm and 90 nm, between 50 nm and 60 nm, between 50 nm and 70 nm, between 50 nm and 80 nm, between 50 nm and 90 nm, between 60 nm and 70 nm, between 60 nm and 80 nm, between 60 nm and 90 nm, between 70 nm and 80 nm, between 70 nm and 90 nm, and between 80 nm and 90 nm in various embodiments. Due to the excitation of a second order mode in the second overmode BAW resonator 22, the device may provide a resonant frequency greater than about 3.0 GHz. Accordingly, the second overmode BAW resonator 22 may be highly useful in high frequency applications.

Figure 8:
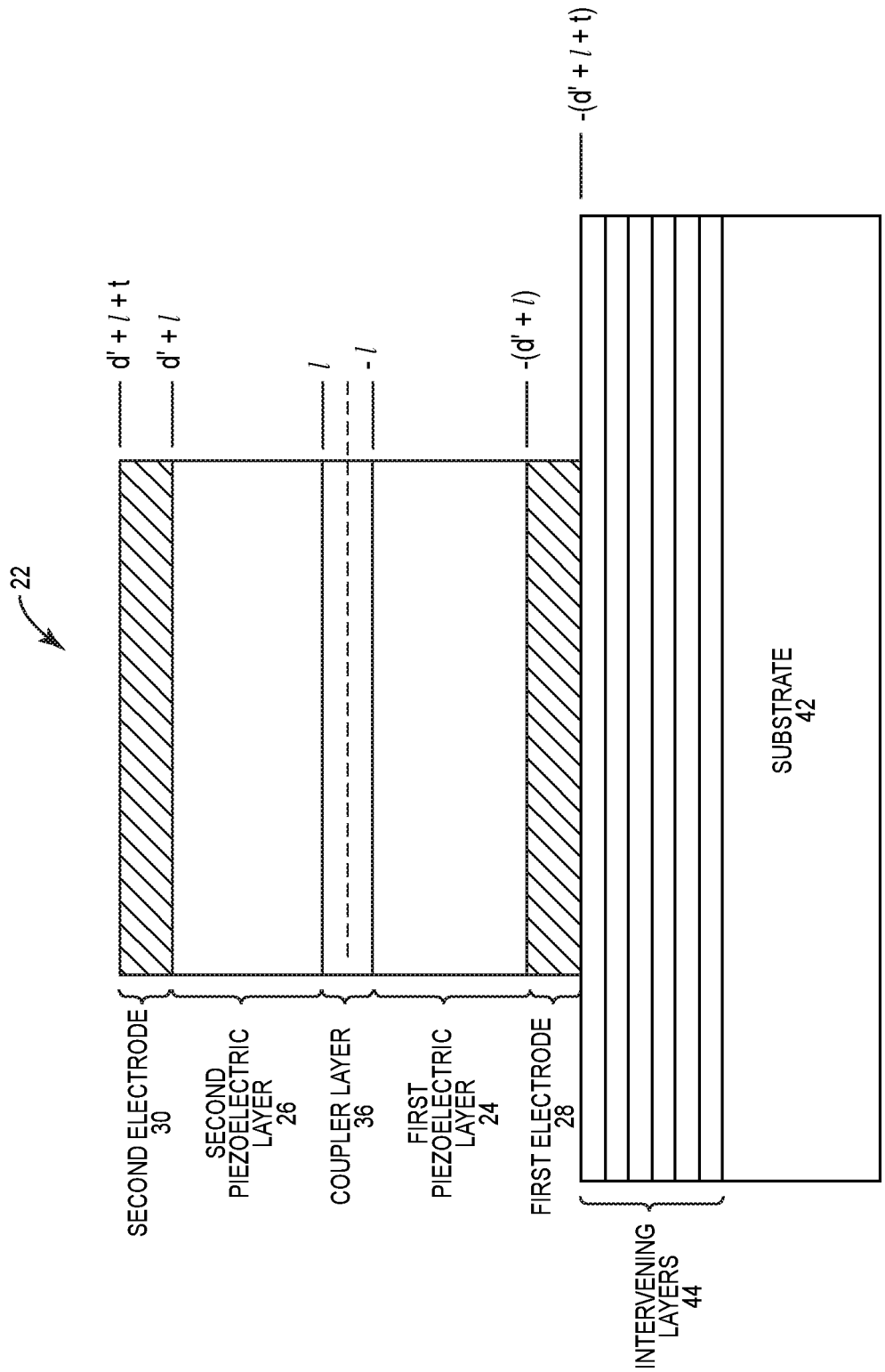
FIG. 8 illustrates a second overmode BAW resonator according to one embodiment of the present disclosure.

The second overmode BAW resonator 22 may be a solidly mounted resonator (SMR) as shown in FIG. 8. In such an embodiment, the second overmode BAW resonator 22 is provided on a substrate 42 over which a number of intervening layers 44 are provided such that the intervening layers 44 are located between the second overmode BAW resonator 22 and the substrate 42. The intervening layers 44 may comprise a number of alternating layers of high and low acoustic impedance materials. Details of the substrate 42 and the intervening layers 44 will be readily appreciated by those skilled in the art and thus are not discussed herein.

Figure 9:
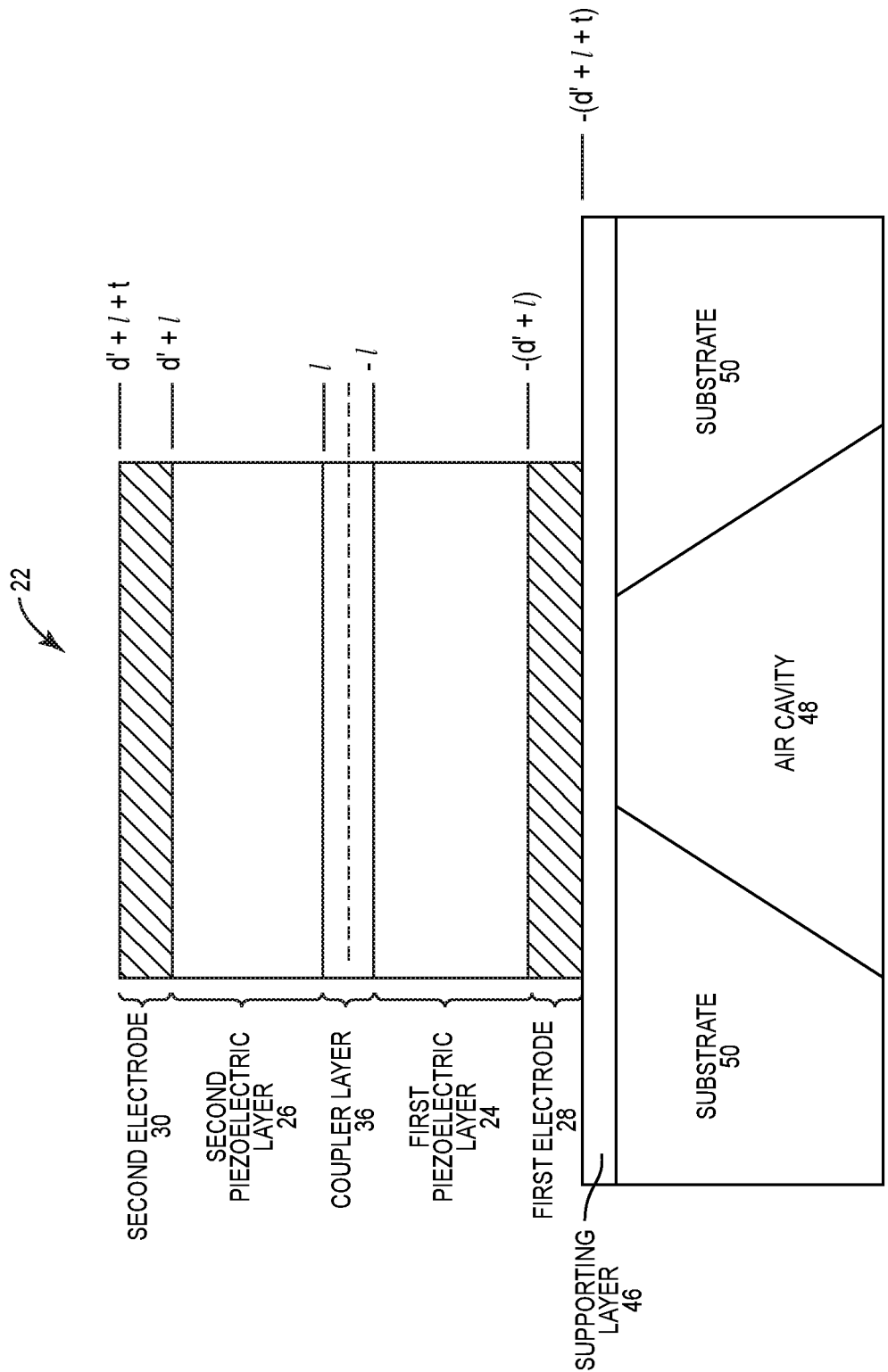
FIG. 9 illustrates a second overmode BAW resonator according to one embodiment of the present disclosure.

The second overmode BAW resonator 22 may also be a thin-film bulk acoustic wave resonator (FBAR) as shown in FIG. 9. In such an embodiment, the second overmode BAW resonator 22 is provided on a supporting layer 46 and suspended over an air cavity 48 by a substrate 50. Details of the supporting layer 46, the air cavity 48, and the substrate 50 will be readily appreciated by those skilled in the art and thus are not discussed herein.

While not shown, the second overmode BAW resonator 22 may be used in any number of different supporting structures to create any number of different circuit topologies. In various embodiments, the second overmode BAW resonator 22 may be coupled either electrically or acoustically with one or more other resonators or components to form filtering circuitry such as duplexers, multiplexers, and the like. The details of these structures will be readily appreciated by those skilled in the art, and thus are not discussed herein.

Those skilled in the art will recognize improvements and modifications to the preferred embodiments of the present disclosure. All such improvements and modifications are considered within the scope of the concepts disclosed herein and the claims that follow.

What is claimed is:

1. A second overmode bulk acoustic wave (BAW) resonator comprising:
   a first piezoelectric layer having a first polarity;
   a second piezoelectric layer having a second polarity, wherein the first polarity and the second polarity have opposing signs of a piezoelectric constant;
   a coupler layer between the first piezoelectric layer and the second piezoelectric layer;
   a first electrode on the first piezoelectric layer opposite the coupler layer;

a second electrode on the second piezoelectric layer opposite the coupler layer;
wherein the second overmode BAW resonator is configured to excite a second order mode through the first piezoelectric layer, the coupler layer, and the second piezoelectric layer.

2. The second overmode BAW resonator of claim 1 wherein:
the coupler layer has a first acoustic impedance; and
the first piezoelectric layer and the second piezoelectric layer have a second acoustic impedance such that the first acoustic impedance divided by the second acoustic impedance is greater than 1.0.

3. The second overmode BAW resonator of claim 2 wherein the first acoustic impedance divided by the second acoustic impedance is greater than 1.5.

4. The second overmode BAW resonator of claim 2 wherein the first acoustic impedance divided by the second acoustic impedance is greater than 2.0.

5. The second overmode BAW resonator of claim 2 wherein the first acoustic impedance divided by the second acoustic impedance is greater than 3.0.

6. The second overmode BAW resonator of claim 2 wherein the coupler layer is a metal layer.

7. The second overmode BAW resonator of claim 6 wherein the first piezoelectric layer and the second piezoelectric layer are aluminum nitride.

8. The second overmode BAW resonator of claim 7 wherein the first electrode and the second electrode are tungsten.

9. The second overmode BAW resonator of claim 6 wherein the coupler layer is one of molybdenum, tungsten, and osmium.

10. The second overmode BAW resonator of claim 9 wherein the first piezoelectric layer and the second piezoelectric layer are aluminum nitride.

11. The second overmode BAW resonator of claim 10 wherein the first electrode and the second electrode are tungsten.

12. The second overmode BAW resonator of claim 2 wherein:
a thickness of the first piezoelectric layer and the second piezoelectric layer is between 350 nm and 1050 nm; and
a thickness of the coupler layer is between 30 nm and 120 nm.

13. The second overmode BAW resonator of claim 2 wherein:
the coupler layer has a first thickness; and
the first electrode and the second electrode have a second thickness such that the first thickness divided by the second thickness is between 0.1 and 0.4.

14. The second overmode BAW resonator of claim 13 wherein:
a thickness of the first piezoelectric layer and the second piezoelectric layer is between 350 nm and 1050 nm;
the first thickness of the coupler layer is between 30 nm and 120 nm; and
the second thickness of the first electrode and the second electrode is between 100 nm and 300 nm.

15. The second overmode BAW resonator of claim 14 wherein:
the first piezoelectric layer and the second piezoelectric layer are aluminum nitride;
the coupler layer is one of molybdenum, tungsten, and osmium; and
the first electrode and the second electrode are tungsten.

16. The second overmode BAW resonator of claim 13 wherein the first thickness divided by the second thickness is between 0.2 and 0.3.

17. The second overmode BAW resonator of claim 16 wherein:
a thickness of the first piezoelectric layer and the second piezoelectric layer is between 350 nm and 1050 nm;
the first thickness of the coupler layer is between 30 nm and 120 nm; and
the second thickness of the first electrode and the second electrode is between 100 nm and 300 nm.

18. The second overmode BAW resonator of claim 17 wherein:
the first piezoelectric layer and the second piezoelectric layer are aluminum nitride;
the coupler layer is one of molybdenum, tungsten, and osmium; and
the first electrode and the second electrode are tungsten.

19. The second overmode BAW resonator of claim 1 wherein the coupler layer provides an acoustic impedance between the first piezoelectric layer and the second piezoelectric layer in order to provide an increased integral of a stress profile of the second overmode BAW resonator.

20. The second overmode BAW resonator of claim 19 wherein the acoustic impedance provided by the coupler layer provides an enhanced effective electromechanical coupling of the second overmode BAW resonator.

* * * * *